United States Patent
Igarashi et al.

(10) Patent No.: US 8,518,830 B2
(45) Date of Patent: Aug. 27, 2013

(54) PLASMA ETCHING METHOD AND STORAGE MEDIUM

(75) Inventors: Yoshiki Igarashi, Miyagi (JP); Kazuki Narishige, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/428,223

(22) Filed: Mar. 23, 2012

(65) Prior Publication Data

US 2012/0244709 A1 Sep. 27, 2012

Related U.S. Application Data

(60) Provisional application No. 61/472,662, filed on Apr. 7, 2011.

(30) Foreign Application Priority Data

Mar. 25, 2011 (JP) ................................. 2011-068694

(51) Int. Cl.
*H01L 21/311* (2006.01)
(52) U.S. Cl.
USPC ...................... 438/700; 257/E21.218; 216/71
(58) Field of Classification Search
USPC ................... 438/700; 257/E21.218; 216/71
See application file for complete search history.

(56) References Cited

U.S. PATENT DOCUMENTS

| | | | |
|---|---|---|---|
| 2007/0221493 A1* | 9/2007 | Honda et al. | 204/192.1 |
| 2009/0045165 A1* | 2/2009 | Narishige et al. | 216/41 |
| 2009/0242516 A1* | 10/2009 | Honda et al. | 216/71 |
| 2010/0213162 A1* | 8/2010 | Mochiki et al. | 216/17 |

FOREIGN PATENT DOCUMENTS

| | | |
|---|---|---|
| JP | 2004-214465 | 7/2004 |
| JP | 2006-351862 | 12/2006 |

* cited by examiner

*Primary Examiner* — Shaun Campbell
(74) *Attorney, Agent, or Firm* — Cantor Colburn LLP

(57) ABSTRACT

Disclosed is a plasma etching method capable of carrying out an etching process while preventing an etching shape defect such as a bowing from occurring. The plasma etching method includes etching an organic film formed on the substrate to a middle depth using an inorganic film as a mask by generating plasma between an upper electrode a surface of which is formed with a silicon containing material and a lower electrode where a substrate to be processed is placed thereon in a processing chamber; forming a protective film including the silicon containing material of the upper electrode on a side wall of an etching region formed from the etching process by applying a negative DC voltage on the upper electrode while generating the plasma; and continuing the etching process using the plasma thereby etching the organic film to a predetermined depth.

8 Claims, 7 Drawing Sheets

| | 100nm | ~304 |
| ArF PR | | |
| Si-ARC 35nm | | ~303 |
| SOC 200nm (ORGANIC FILM) | | ~302 |
| SiN | | ~301 |

FIG. 8

| | (a) RECIPE C (PRIOR ART) | (b) RECIPE D (PRESENT DISCLOSURE) |
|---|---|---|
| Si-ArC / SOC / SiN | Bowing | Vertical |
| CD: Bow/Btm(nm) | 48.2/39.3 | 36.7/33.0 |
| △CD: Bow−Btm(nm) | 8.9 | 3.7 |

PLASMA ETCHING METHOD AND STORAGE MEDIUM

CROSS-REFERENCE TO RELATED APPLICATIONS

This application is based on and claims priority from Japanese Patent Application No. 2011-068694, filed on Mar. 25, 2011, with the Japanese Patent Office, the disclosure of which is incorporated herein in its entirety by reference. Also, this application claims the benefit of U.S. Provisional Application No. 61/472,662 filed on Apr. 7, 2011, with the United States Patent and Trademark Office, the disclosure of which is incorporated herein in its entirety by reference.

TECHNICAL FIELD

The present disclosure relates to a plasma etching method for performing a plasma etching of an organic film and a storage medium thereof.

BACKGROUND

In a manufacturing process of a semiconductor device, a high aspect ratio etching is required for etching hole patterns or line patterns according to miniaturization of a design rule. To this end, there has been proposed a method of using a mask having a structure in which an inorganic film and an organic film such as amorphous carbon are stacked (multilayer resist) below a photoresist film.

When an organic film such as amorphous carbon is etched using an inorganic film as a mask, $O_2$ gas or $N_2$ gas is typically used as an etching gas. See, for example, Japanese Patent Application Laid-Open Nos. 2004-214465 and 2006-351862. In addition, $H_2$ gas is also used for etching an organic film.

SUMMARY

An exemplary embodiment of the present disclosure provides a plasma etching method using a plasma etching apparatus including: etching an organic film formed on a substrate to be processed to a middle depth using an inorganic film as a mask by generating plasma between an upper electrode a surface of which is formed with a silicon containing material and a lower electrode where the substrate is placed thereon in a processing chamber; after the etching process, forming a protective film including the silicon containing material of the upper electrode on a side wall of an etching region formed from the etching process by applying a negative DC voltage on the upper electrode while generating the plasma; and after the forming process, continuing the etching process using the plasma thereby etching the organic film to a predetermined depth.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof The illustrative embodiments described in the detailed description, drawing, and claims are not meant to be limiting. Other embodiments may be utilized, and other changes may be made, without departing from the spirit or scope of the subject matter presented here.

In a case where an organic film such as amorphous carbon is etched by using an inorganic film as a mask, an etching shape defect such as a side etch or a bowing occurs when the high aspect ratio etching of the organic film is carried out. As a result, there is a problem in that a vertical processing and a fine processing are difficult to perform.

The present disclosure has been made in an effort to provide a plasma etching method capable of etching an organic film using an inorganic film as a mask without occurrence of etching shape defects, and a computer readable storage medium storing a program that, when executed, causes a computer to perform the method.

According to an aspect of the present disclosure, there is provided a plasma etching method using a plasma etching apparatus including etching an organic film formed on a substrate to be processed to a middle depth using an inorganic film as a mask by generating plasma between an upper electrode a surface of which is formed with a silicon containing material and a lower electrode where the substrate is placed thereon in a processing chamber, after the etching process, forming a protective film including the silicon containing material of the upper electrode on a side wall of an etching region formed from the etching process by applying a negative DC voltage on the upper electrode while generating the plasma, and after the forming process, continuing the etching process using the plasma thereby etching the organic film to a predetermined depth.

In the plasma etching method of the exemplary embodiment, the etching process and the continuing process may be performed by using an $O_2$ containing gas as a plasma generating gas. Further, the forming process and the continuing process may be repeatedly performed in plural times. The plasma etching method further includes determining a depth position of an etching shape defect in advance to perform the forming process at the timing corresponding to the depth position.

In the plasma etching method of the exemplary embodiment, the forming process may be performed by using plasma containing $H_2$ gas. In this case, the plasma used in the forming process may further include a fluorine containing gas.

The plasma etching method of the exemplary embodiment may further include, after the forming process, processing the substrate using plasma including a fluorine containing gas.

According to another aspect of the present disclosure, there is provided a computer-readable storage medium storing a computer executable program that, when executed, causes a computer to control a plasma etching apparatus to perform a plasma etching method including: etching an organic film formed on the substrate to a middle depth using an inorganic film as a mask by generating plasma between an upper electrode a surface of which is formed with a silicon containing material and a lower electrode where a substrate to be processed is placed thereon in a processing chamber; after the etching process, forming a protective film including the silicon containing material of the upper electrode on a side wall of an etching region formed from the etching process by applying a negative DC voltage on the upper electrode while generating the plasma; and after the forming process, continuing the etching process using the plasma thereby etching the organic film to a predetermined depth.

According to exemplary embodiments of the present disclosure, since the protective film made of the silicon containing material is formed on a side wall of an etching region by applying a negative DC voltage on the upper electrode during an etching process when an organic film is etched by using an inorganic film, it is possible to carry out an etching process while preventing the etching shape defects such as a bowing from occurring.

Hereinafter, exemplary embodiments of the present disclosure will be described in detail with reference to the accompanying drawings.

<Plasma Etching Apparatus>

Figure 1:
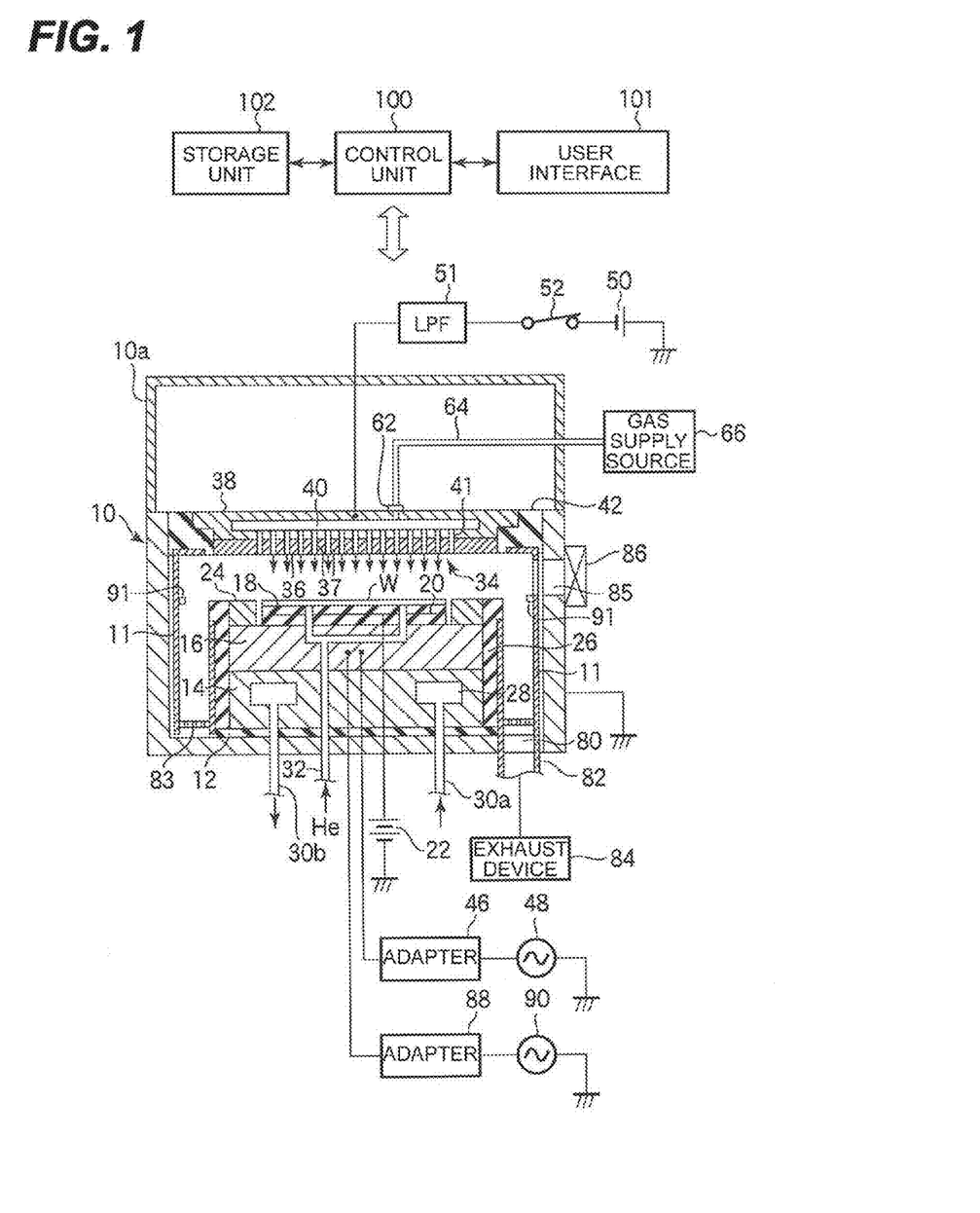
FIG. 1 is a schematic sectional view illustrating a plasma etching apparatus capable of performing a plasma etching method of the present disclosure.

FIG. 1 is a schematic sectional view illustrating an example of a plasma etching apparatus for performing a plasma etching method according to an exemplary embodiment of the present disclosure.

The plasma etching apparatus is configured as a capacitive-coupled parallel plate plasma etching apparatus. Further, the plasma etching apparatus includes a substantially cylindrical chamber 10 (processing vessel) of which surface is made of anodized aluminum, for example, and frame grounded.

A columnar susceptor support 14 is placed on a bottom of chamber 10 via an insulating plate 12 made of, for example, ceramics. A susceptor 16 made of, for example, aluminum is provided on susceptor support 14. Susceptor 16 constitutes a lower electrode, and a semiconductor wafer W is placed thereon as an example of a substrate to be processed. An organic film is formed on semiconductor wafer W as an etching target of the present disclosure.

An electrostatic chuck 18 is provided on a top surface of susceptor 16 and configured to adsorb and hold semiconductor wafer W by an electrostatic force. Electrostatic chuck 18 has a structure in which an electrode 20 made of a conductive film is sandwiched between a pair of insulating layers or insulating sheets. A DC power source 22 is electrically connected to electrode 20. Semiconductor wafer W is adsorbed and held on electrostatic chuck 18 by an electrostatic force such as a coulomb force which is generated by a DC voltage from DC power source 22.

A conductive focus ring 24 (correction ring) made of silicon or a Si-based material containing an impurity such as, for example, B and P, for example, is placed on a top surface of susceptor 16 around electrostatic chuck 18, that is, around semiconductor wafer W in order to improve uniformity of etching. A cylindrical inner wall member 26 is made of, for example, quartz and is provided on a side surface of susceptor 16 and susceptor support 14.

A refrigerant chamber 28 is provided inside of susceptor support 14, for example, on the circumference thereof. A refrigerant with a predetermined temperature such as, for example, a coolant is circulated and supplied from an external chiller unit (not shown) to the coolant chamber via pipes 30a, 30b, and therefore, it is possible to control the processing temperature of semiconductor wafer W on susceptor 16 by the temperature of the refrigerant.

Further, a heat-transfer gas, for example, He gas is supplied from a heat-transfer gas supply mechanism (not shown) to a region between a top surface of electrostatic chuck 18 and a back surface of semiconductor wafer W via a gas supply line 32.

An upper electrode 34 is provided above susceptor 16 that serves as the lower electrode to face susceptor 16 in parallel. A space between upper electrode 34 and lower electrode 16 serves as a plasma generating space. Upper electrode 34 faces semiconductor wafer W on susceptor 16 to form an opposing surface contacting with the plasma generating space.

Upper electrode 34 is supported on an upper portion of chamber 10 via an insulating shield member 42, and includes an electrode plate 36 and an electrode support 38. The electrode plate constitutes an opposing surface to susceptor 16 and has a plurality of gas discharge holes 37. Electrode support 38 is configured to removably support electrode plate 36 and has a water-cooled structure which is made of a conductive material such as, for example, aluminum. Electrode plate 36 is made of a silicon containing material such as, for example, Si or SiC. A gas diffusion chamber 40 is provided inside of electrode support 38. A plurality of gas flowing holes 41 are communicated with gas discharge holes 37 and extend downward from gas diffusion chamber 40.

Electrode support 38 is formed with a gas inlet 62 for directing a processing gas toward gas diffusion chamber 40. A gas supply pipe 64 is connected to gas inlet 62. A gas supply source 66 is connected to gas supply pipe 64 and supplies a processing gas required. A plurality of gas pipes are connected to gas supply pipe 64 and provided with a flow controller and an opening/closing valve (both not shown). The required processing gas is supplied from gas supply source 66 to gas diffusion chamber 40 through gas supply pipe 64 and is discharged toward the plasma generating space in a shower manner through gas flowing holes 41 and gas discharge holes 37. That is, upper electrode 34 functions as a shower head for supplying a processing gas.

A variable DC power source 50 is electrically connected to upper electrode 34 via a low pass filter (LPF) 51. Variable DC power source 50 is connected in such a way that a negative electrode becomes upper electrode 34 side, and configured to apply a negative voltage to upper electrode 34. Power feeding from variable DC power source 50 can be turned ON/OFF by switch 52. LPF 51 is configured to trap a high frequency from a first and a second high-frequency power sources which will be described later and may be constituted with LR filter or LC filter.

A cylindrical grounded conductor 10a is provided to extend from a side wall of chamber 10 upwardly beyond a height position of upper electrode 34.

A first high-frequency power source 48 is electrically connected to susceptor 16 via a first adapter 46. First high-frequency power source 48 outputs a high frequency power of 27 MHz to 100 MHz, for example, 40 MHz. First adapter 46 is configured to match a load impedance to an inner (or output) impedance of first high-frequency power source 48. First adapter 46 functions to match the output impedance of first high-frequency power source 48 and the load impedance when plasma is generated within chamber 10.

Further, a second high-frequency power source 90 is electrically connected to susceptor 16 via a second adapter 88. A high-frequency bias is applied to semiconductor wafer W and thus ions are drawn into semiconductor wafer W by supplying a high-frequency power from second high-frequency power source 90 to susceptor 16. Second high-frequency power source 90 outputs a high frequency power of 400 kHz to 20 MHz, for example, 13 MHz. Second adapter 88 is configured to match a load impedance to an inner (or output) impedance of second high-frequency power source 90. Second adapter 88 functions to match the inner impedance of second high-frequency power source 90 and the load impedance including plasma in chamber 10 when plasma is generated within chamber 10.

An exhaust port 80 is provided at the bottom of chamber 10 and is connected to an exhaust device 84 through an exhaust pipe 82. Exhaust device 84 includes a vacuum pump such as a turbo molecular pump to reduce the pressure of chamber 10 to a desired vacuum level. Further, a transfer port 85 for semiconductor wafer W is provided in the side wall of chamber 10 and is opened/closed by a gate valve 86. In addition, a deposit shield 11 is detachably disposed along an inner wall of chamber 10 to prevent etching by-products (deposits) from being adhered to chamber 10. That is, deposit shield 11 constitutes a chamber wall, and is also provided on an outer periphery of inner wall member 26. An exhaust plate 83 is disposed at the bottom of chamber 10 between deposit shield 11 on the chamber wall side and deposit shield 11 on inner wall member 26 side. Deposit shield 11 and exhaust plate 83 may be made of an aluminum body covered with a ceramics such as $Y_2O_3$.

A conductive member (GND block) 91 is disposed on a portion of deposit shield 11 that constitutes the inner wall of the chamber at a height substantially the same as semiconductor wafer W, and is connected to ground in DC. Thereby, there is an advantage of preventing an abnormal discharge. The position of conductive member 91 is not limited to the position illustrated in FIG. 1, as long as the conductive member is provided in the plasma generating space. The conductive member may be provided in susceptor 16, for example, in the vicinity of susceptor 16. Alternatively, the conductive member may be provided in the vicinity of upper electrode 34, for example, outside of the upper electrode in a ring-shape.

Each component of the plasma etching apparatus such as, for example, a power supply system or a gas supply system, a driving system, first high-frequency power source 48, second high-frequency power source 90 and adapters 46, 88 are connected to and controlled by a control unit (entire control system) 100 including a microprocessor (computer). Control unit 100 is connected to a user interface 101 including a keyboard and a display. The keyboard is used for a process operator to input commands for operating the plasma etching apparatus and the display is used for showing visualized images of the operational status of the plasma etching apparatus.

Further, control unit 100 is connected to a storage unit 102 which stores control programs for control unit 100 to control the plasma etching apparatus so as to perform various processes or a program (i.e., processing recipes) for respective components of the plasma etching apparatus to perform the processes in accordance with process conditions. The processing recipes are stored on a storage medium within storage unit 102. The storage medium may be a hard disk or a semiconductor memory, or a portable storage medium, such as a CDROM, a DVD or a flash memory. Further, the processing recipes may be suitably transmitted from other devices to the storage unit, for example, via a dedicated line.

A required recipe is retrieved from storage unit 102 and executed by control unit 100 in accordance with an instruction from user interface 101, thereby allowing the plasma etching apparatus to perform a predetermined process under the control of control unit 100.

<Embodiment of Plasma Etching Method>

Hereinafter, a plasma etching method according to an embodiment of the present disclosure will be described, which can be carried out by the plasma etching apparatus thus configured.

Figure 2:
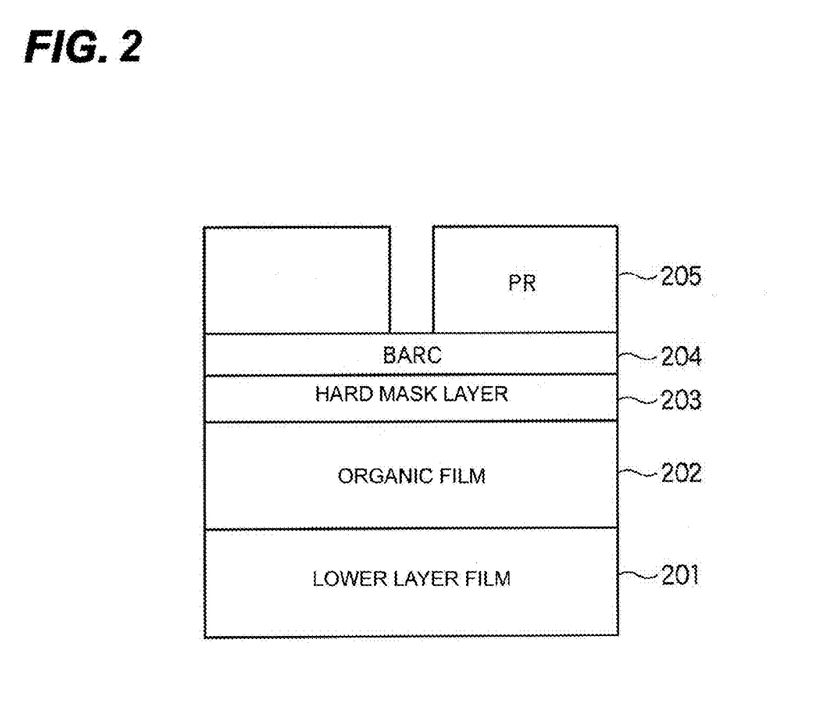
FIG. 2 is a view schematically illustrating an example of a structure of a semiconductor wafer which can be employed in the plasma etching method according to an exemplary embodiment of the present disclosure.
Figure 3:
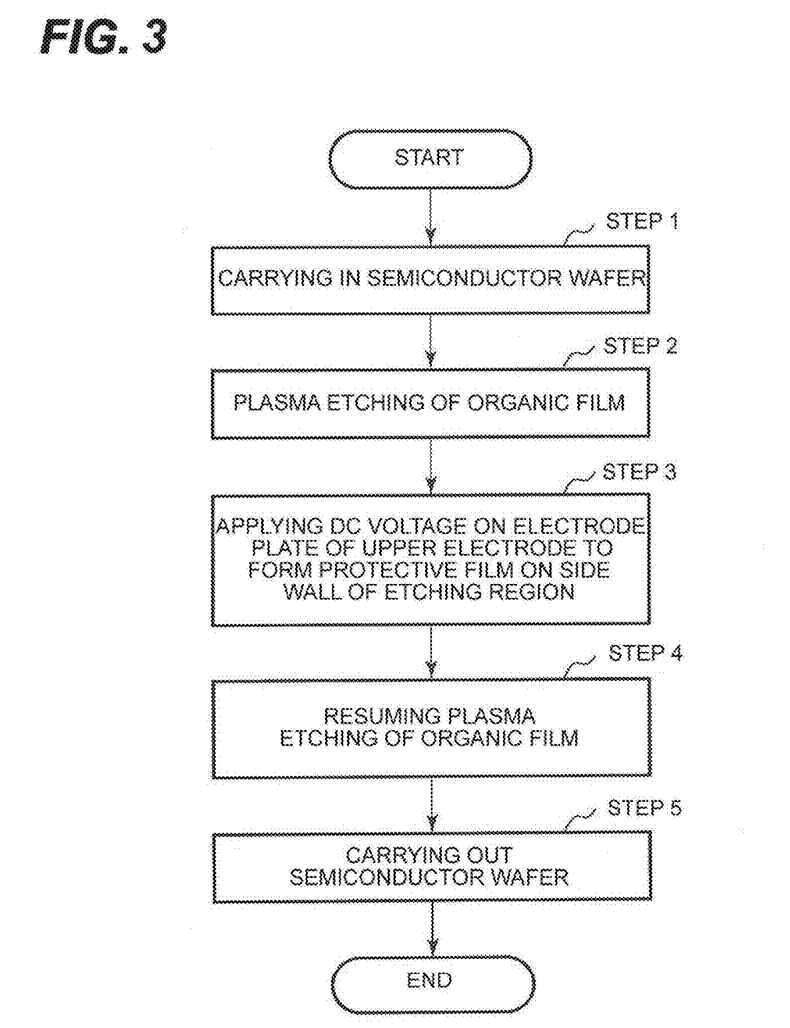
FIG. 3 is a flowchart for explaining the plasma etching method according to an exemplary embodiment of the present disclosure.

In the present embodiment, semiconductor wafer W having a structure as illustrated in FIG. 2 is used as an example and an exemplary case where an organic film of the semiconductor wafer is etched with plasma will be described by referring to the flow-chart as illustrated in FIG. 3.

Semiconductor wafer W used in this embodiment has a following structure. First, a lower layer film 201 serving as a final etching target, an organic film 202 serving as an etching target in the present embodiment, a hard mask layer (inorganic film) 203 serving as an etching mask of the organic film 202, an organic anti-reflective film (BARC) 204 and a photoresist film 205 are sequentially formed on a substrate (not shown). And then, a predetermined pattern is formed on photoresist film 205 by a photolithography process. In this structure, upper multilayer resist structures 202 to 205 are utilized to etch lower layer film 201 serving as an etching target. In this embodiment, organic film 202 configured as a mask for etching the final etching target (lower layer film 201) is an etching target.

Organic film 202 used as an etching target in the present embodiment is not particularly limited but an organic film typically used in this filed may be utilized. For example, amorphous carbon (a-C) or SOC (spin-on-carbon) may be suitably used. The thickness of organic film 202 is approximately 100 nm to 1000 nm.

Hard mask layer 203 is not particularly limited to a specific layer, as long as an inorganic film is used. For example, Si containing film such as SiON film, SiC film, SiN film, $SiO_2$ film, SOG film may be suitably used and the thickness thereof is approximately 10 nm to 100 nm. Further, SiON film or any organic film may be used as anti-reflective film (BARC) 204 and the thickness thereof is approximately 20 nm to 100 nm. Photoresist film 205 is typically an ArF resist and the thickness thereof is approximately 20 nm to 200 nm.

In order to simplify the description, description will be made for an etching process of semiconductor wafer W (see, for example, FIG. 2) where anti-reflective film (BARC) 204 and hard mask layer 203 are etched by using photoresist film 205 as a mask, and then, semiconductor wafer W is carried into chamber 10 to be placed on susceptor 16 for an etching process.

After semiconductor wafer W is placed on susceptor 16 (step 1), etching gas is supplied from gas supply source 66 to gas diffusion chamber 40 in a predetermined flow rate while chamber 10 is evacuated by exhaust device 84. Next, the etching gas is supplied to chamber 10 through gas flowing holes 41 and gas discharge holes 37. At this time, the pressure within the chamber is set to 5 mTorr to 800 mTorr, for example. And then, first high-frequency power source 48 applies a high-frequency power to susceptor 16 for generating plasma. The high-frequency power has a relatively high frequency of 27 MHz to 100 MHz, for example, 40 MHz and is applied in a power of 100 W to 2000 W. Further, second high-frequency power source 90 applies a high-frequency power for drawing ions into susceptor 16. The high-frequency power has a relatively high frequency of 40 kHz to 20 MHz, for example, 13 MHz, and is applied in a power of 0 W to 2000 W. In this way, plasma etching is performed for organic film 202 using hard mask layer 203 as a mask (step 2). At this time, various gases such as $O_2$ gas, $O_2$ gas+COS gas, $N_2$ gas, $H_2$ gas, may be suitably used as the etching gas.

Subsequently, the supply of the etching gas stops and processing gas for forming a protective film is supplied. At this time, the pressure of chamber 10 is set to 5 mTorr to 800 mTorr, for example. Next, the high-frequency power from first high-frequency power source 48 is lowered to 100 W to 2000 W and the high-frequency power from second high-frequency power source 90 is set to 0 W to 2000 W. Further, a negative DC voltage of, for example, 100 V to 2000 V is supplied from variable DC power source 50 to electrode plate 36. In this way, the protective film is formed on the side wall of the etching region (step 3).

At this time, $H_2$ gas or $H_2$ containing gas such as $H_2$ gas+Ar gas may be suitably utilized as the processing gas. $H_2$ gas may be used to reduce the roughness of the etching. However, when $H_2$ is used alone, it is difficult to generate plasma and sputtering amount of Si containing material tends to be reduced. Accordingly, in this case, Ar gas may be added. Owing to adding the Ar gas, it is easy to generate plasma and the sputtering amount of Si containing material is increased.

Figure 4:
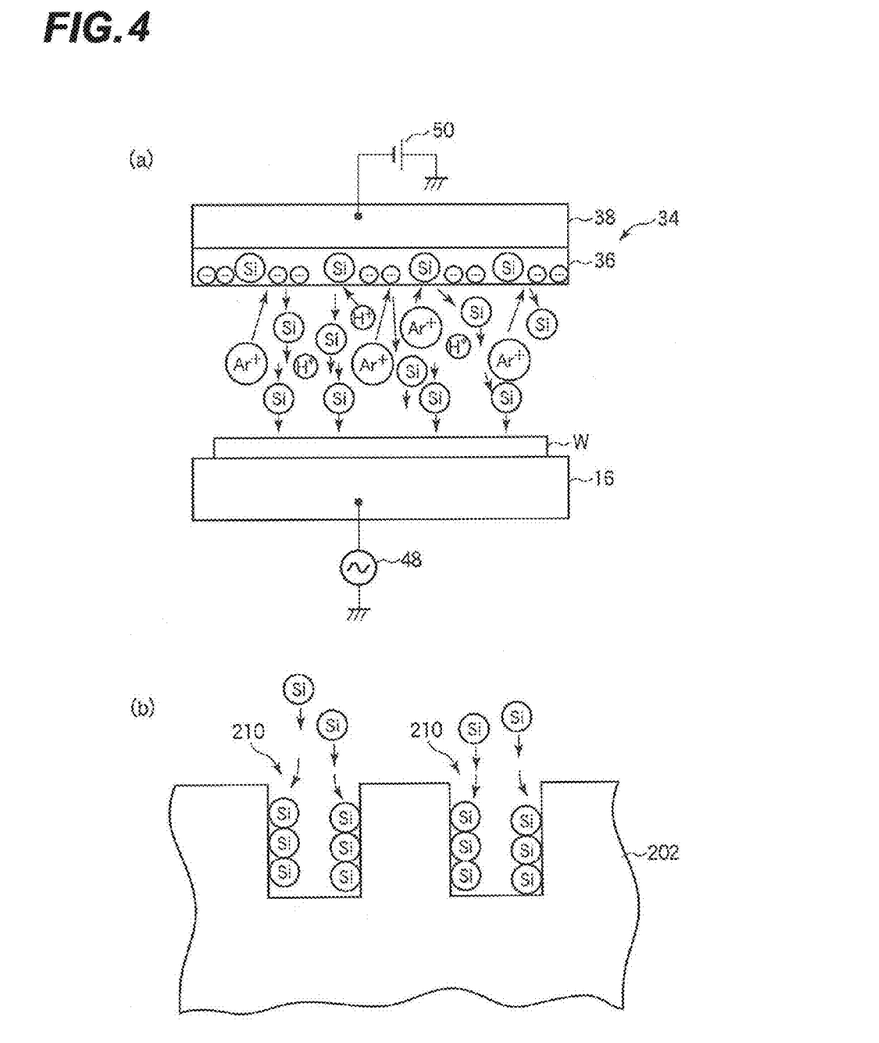
FIG. 4 is a view for explaining the principle of the present disclosure.

Referring to FIG. 4, a mechanism for forming the protective film will be described. As illustrated in FIG. 4(*a*), for example, Ar ion ($Ar^+$), H ion ($H^+$) and H radical ($H^*$) are present in the plasma generated by first high-frequency power source 48. However, when variable DC power source 50 applies a negative voltage on electrode plate 36 containing Si, $Ar^+$ or $H^+$ is attracted to electrode plate 36 and collided with electrode plate 36. As a result, Si containing material constituting electrode plate 36 is discharged and poured toward semiconductor wafer W. The Si containing material is adhered to a side wall of the etching region 210 such as a trench or hole which is formed to a middle depth of organic film 202, as illustrated in FIG. 4(*b*). In this way, the protective film is formed with the Si containing material and thus etching shape defects such a bowing are suppressed.

Meanwhile, in an etching of patterns with wider grooves, there is a risk that a normal etching is difficult to perform in a state where the Si containing material is adhered to a bottom of grooves. In this case, F containing gas such as $CF_4$, $CHF_3$, $CH_2F_2$, $CH_3F$, $SF_6$, and $NF_3$ may be added into the plasma of $H_2$ gas or $H_2$ gas+Ar gas to eliminate extra Si containing material in the bottom of the grooves. Alternatively, after the protective film is formed by applying the DC voltage, the extra Si containing material may be eliminated by being subjected to the plasma of F containing gas such as $CF_4$, $CHF_3$, $CH_2F_2$, $CH_3F$, $SF_6$, and $NF_3$. Meanwhile, in an etching of patterns with narrower grooves, since the amount of Si containing material vertically introduced becomes less, the amount of the Si containing material becomes less in the bottom of the grooves as well. Accordingly, it may not be necessary to eliminate extra Si containing material.

After the protective film is formed, the supply of the processing gas for forming the protective film stops and the etching gas is supplied again. The powers of first and second high-frequency power sources 48, 90 and the pressure in chamber 10 are returned to the etching condition as in step 2, for example, and the etching of organic film 202 is resumed (step 4).

In this way, as a DC voltage is applied on electrode plate 36 of upper electrode 34 during the etching of organic film 202, the Si containing material is discharged from electrode plate 36 and adhered to the side wall of the etching region. That is, the protective film is formed and then the etching is resumed. Accordingly, it is possible to suppress the etching shape defects such a bowing.

The protective film forming process of step 3 and the etching process of step 4 may be repeatedly performed in plural times. When etching shape defects such as a bowing are present in plural regions, the suppression effect of the etching shape defects such a bowing may be increased by repeatedly performing step 3 and step 4 in plural times.

Further, the depth position of a large bowing may be checked in advance by first step etching and the protective film forming process is performed in one or multiple times at the timing corresponding to the depth position. In this way, the suppression effect of the etching shape defects such a bowing may be even further increased.

After the etching process of step 4 is performed during an over-etching time, semiconductor wafer W is carried out from chamber (step 5).

<Experimental Result>

Next, effects of the present disclosure confirmed by experimental results will be described below.

In this experiment, a semiconductor wafer having a structure illustrated in FIG. 2 was used. In this structure, an amorphous carbon having a thickness of 200 nm to 300 nm was used as an organic film 202 and SiON having a thickness of 20 nm was used as a hard mask 203. Further, (organic-based) BARC 204 having a thickness of 24 nm and a photoresist film 205 having a thickness of 90 nm were subsequently formed on the SiON. And then, Line & Space patterns were formed on photoresist film 205 by a photolithography process.

This sample was carried into the apparatus of FIG. 1 and then the amorphous carbon film thereof was etched by a conventional recipe A of following 1 step and recipe B of steps 2 to 4 of the present disclosure performed in following conditions. High frequency bias from a second high frequency power source was set to 13 MHz, 0 W in all cases.

1. Recipe A (1 step: conventional recipe)
   Chamber pressure: 10 mTorr
   First high frequency power source: 40 MHz, 600 W
   Etching gas: $O_2$/COS=300/60 sccm
   Time: 75 sec
2. Recipe B (recipe of the present disclosure)
   Step 2
     Chamber pressure: 10 mTorr
     First high frequency power source: 40 MHz, 600 W
     Etching gas: $O_2$/COS=300/60 sccm
     Time: 15 sec
   Step 3
     Chamber pressure: 50 mTorr
     First high frequency power source: 40 MHz, 300 W
     Processing gas: $H_2$/Ar=100/800 sccm
     DC voltage: −900 V
     Time: 10 sec
   Step 4
     Chamber pressure: 10 mTorr
     First high frequency power source: 40 MHz, 600 W
     Etching gas: $O_2$/COS=300/60 sccm
     Time: 60 sec Results of these etching processing are illustrated in FIG. 5.

Figure 5:
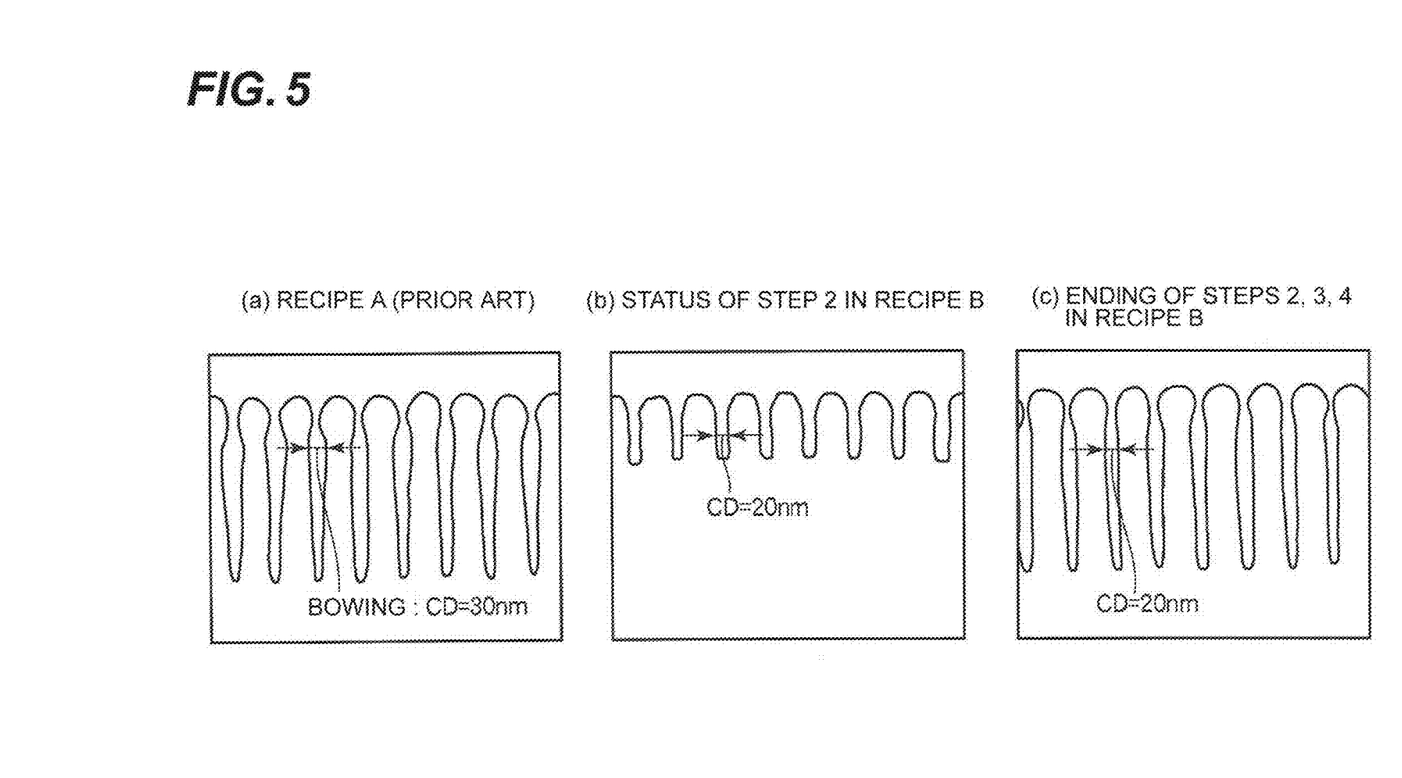
FIG. 5 is a view illustrating a comparison result of an etching shape between an experimental example of the present disclosure and a conventional method.

As illustrated in FIG. 5(a), a side etch is caused on an upper portion of the amorphous carbon film and a bowing shape (CD=30 nm) occurs when the etching is carried out in a single time by the conventional recipe A. As a result, it was found out that a fine processing is difficult to perform.

In contrast, according to the recipe B of the present disclosure, the etching is carried out under the same condition as the conventional recipe and is temporarily stopped (step 2, FIG. 5(b)) in a state where CD equals to 20 nm. Thereafter, DC voltage is applied to plasma to form a protective film (step 3) and then the balance etching is performed (step 4). In this way, CD of FIG. 5(b) is maintained even in the balance etching of the step 4 and therefore it was found out that a vertical processing and a fine processing can be carried out, as illustrated in FIG. 5(c).

Figure 6:
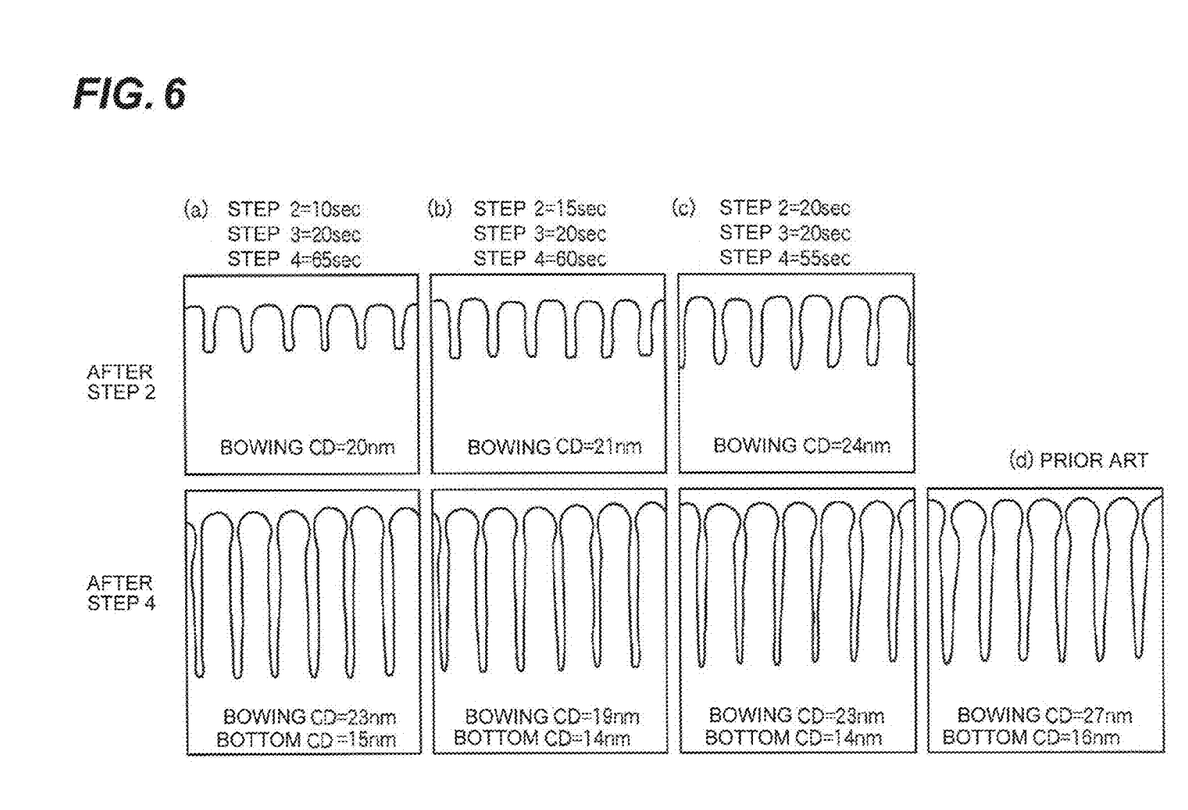
FIG. 6 is a view illustrating a comparison result of an etching shape between another experimental example of the present disclosure and a conventional method.

Next, for the organic film similar to the above experiment, the etching time of the first stage at step 2 is changed to 10 sec, 15 sec and 20 sec and then the protective film forming process of step 3 and the balance etching process (including overetching) of step 4 are carried out. Further, for the purpose of comparison, an etching under the conventional condition was also performed. FIG. 6 illustrates the result. Herein, CD in the widest portion is defined as a bowing CD.

FIG. 6(d) illustrates a state of a conventional etching. In this case, bowing CD equals to 27 nm and therefore a bowing shape occurs.

In contrast, in FIG. 6(a), etching of step 2 is performed for 10 sec (up to a depth 56 nm) and bowing CD becomes 20 nm. From this state, step 3 is performed for 20 sec and step 4 is performed for 65 sec, and thus bowing CD becomes 23 nm. As a result, a slight bowing shape occurs, but the degree of bowing was small as compared to the conventional bowing shape. Further, in FIG. 6(b), etching of step 2 is performed for 15 sec (up to a depth 79 nm) and bowing CD becomes 21 nm. From this state, step 3 is performed for 20 sec and step 4 is performed for 60 sec, and thus bowing CD becomes 19 nm. As a result, a bowing shape did not occur. Further, in FIG. 6(c), etching of step 2 is performed for 20 sec (up to a depth 117 nm) and a bowing shape did occur already in a state where bowing CD equals to 24 nm. However, step 3 was performed for 20 sec and step 4 was performed for 55 sec, and thus bowing CD becomes 23 nm. Consequently, a bowing shape was rather improved and the degree of bowing was small as compared to the conventional bowing shape.

Next, result of the other experiments will be described.

Figure 7:
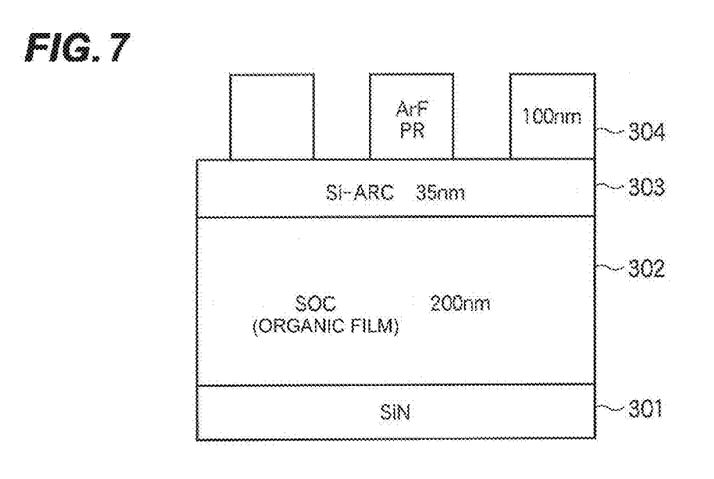
FIG. 7 is a view schematically illustrating a structure of a semiconductor wafer used in yet another experimental example.

In this experiment, Si wafer having a structure illustrated in FIG. 7 was used. The Si wafer has a configuration as follows. First, SiN film 301 corresponding to the lower layer film 201 is stacked on the Si wafer and SOC film as an organic film 302 was formed in a thickness of 200 nm on the SiN film 301. Thereafter, Si-ARC 303 as a hard mask layer was formed in a thickness of 35 nm on the SOC film, and ArF photoresist film 304 was formed in a thickness of 100 nm on the Si-ARC. And then, a predetermined pattern was formed on the ArF photoresist film 304 by a photolithography process.

This sample was carried into the apparatus of FIG. 1 and then the SOC film thereof was etched by a recipe C of following 1 step as a conventional recipe and a recipe D of the steps 2 to 4 as a recipe of the present disclosure in following conditions. High frequency bias from a second high frequency power source was set to 13 MHz, 0 W in all cases.

Figure 8:
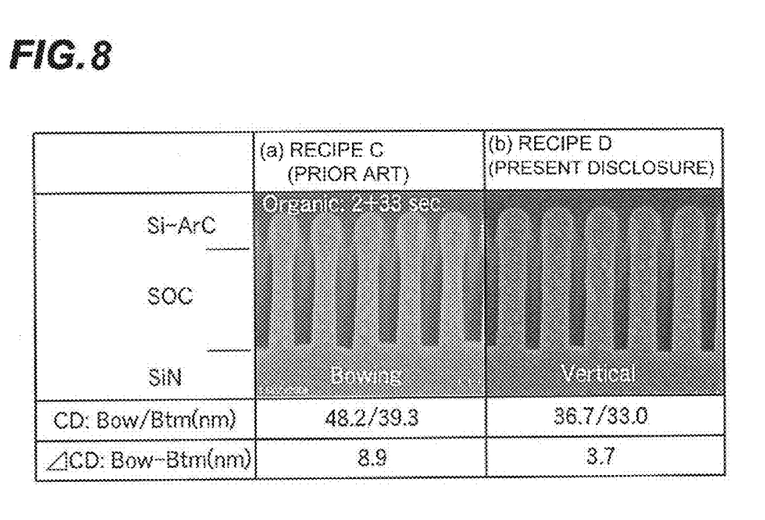
FIG. 8 is a scanning electron microscope (SEM) photograph illustrating a comparison result of an etching shape between yet another experimental example of the present disclosure and a conventional method.

1. Recipe C (1 step: conventional recipe)
   Chamber pressure: 10 mTorr
   First high frequency power source: 40 MHz, 600 W
   Etching gas: $O_2$/COS=300/60 sccm
   Time: 35 sec
2. Recipe D (recipe of the present disclosure)
   Step 2
      Chamber pressure: 10 mTorr
      First high frequency power source: 40 MHz, 600 W
      Etching gas: $O_2$/COS=300/60 sccm
      Time: 15 sec
   Step 3
      Chamber pressure: 50 mTorr
      First high frequency power source: 40 MHz, 300 W
      Processing gas: $H_2$/$CF_4$/Ar=100/40/800 sccm
      DC voltage: −900 V
      Time: 20 sec
   Step 4
      Chamber pressure: 10 mTorr
      First high frequency power source: 40 MHz, 600 W
      Etching gas: $O_2$/COS=300/60 sccm
      Time: 22 sec Results of these etching processing are illustrated in the scanning electron microscope (SEM) photograph of FIG. 8. As illustrated in FIG. 8(a), bowing CD (Bow) equals to 48.2 nm, Bottom CD (Btm) equals to 39.3 nm and ACD (Bow-Btm) equals to 8.9 nm when the etching is carried out in a single time by the conventional recipe C. In contrast, as illustrated in FIG. 8(b), bowing CD (Bow) equals to 36.7 nm, Bottom CD (Btm) equals to 33.0 nm and ACD (Bow-Btm) equals to 3.7 nm when the recipe D of the present disclosure is carried out. From these results, it was found out that bowing shape is suppressed by the present disclosure.

<Other Applications>

Hereinabove, although exemplary embodiments of the present disclosure have been described, the present disclosure is not limited to the exemplary embodiments but can be variously modified. For example, although an apparatus which applies two high frequency powers having different frequencies on a lower electrode has been employed as an apparatus for performing the plasma etching method of the present disclosure in the foregoing embodiment, the apparatus is not limited to this configuration. For example, the apparatus may be configured to apply one high frequency power for generating plasma on a lower electrode or may be configured to apply a high frequency power on an upper electrode. Alternatively, the apparatus may be configured to apply a high frequency power for generating plasma on an upper electrode and apply a high frequency power for bias on a lower electrode. Further, although DC voltage is applied only in the protective film forming process of step 3 in the foregoing embodiment, DC voltage may be applied in the etching process of step 2 and step 4. Further, although a lower organic film of a multilayer resist is etched in the foregoing embodiment, the present disclosure may be applied to an application in which a cylinder itself is used as a practical part. Further, the substrate to be processed is not limited to the semiconductor wafer. For example, the present disclosure may be applied to other substrates such as Flat panel Display (FPD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma etching method using a plasma etching apparatus comprising:

etching an organic film formed on a substrate to be processed to a middle depth using an inorganic film as a mask by generating plasma between an upper electrode a surface of which is formed with a silicon containing material and a lower electrode where the substrate is placed thereon in a processing chamber;

after the etching process, forming a protective film including the silicon containing material of the upper electrode on a side wall of an etching region formed from the etching step by applying a negative DC voltage on the upper electrode while generating the plasma; and after the forming process, continuing the etching process using the plasma thereby etching the organic film to a predetermined depth.

2. The plasma etching method of claim 1, wherein the etching process and the continuing process are performed by using an $O_2$ containing gas as a plasma generating gas.

3. The plasma etching method of claim 1, wherein the forming process and the continuing process are repeatedly performed in plural times.

4. The plasma etching method of claim 1, further comprising determining a depth position of an etching shape defect in advance to perform the forming process at the timing corresponding to the depth position.

5. The plasma etching method of claim 1, wherein the forming process is performed by using plasma containing $H_2$ gas.

6. The plasma etching method of claim 5, wherein the plasma used in the forming process further includes a fluorine containing gas.

7. The plasma etching method of claim 1, further comprising:

after the forming process, processing the substrate by using plasma including a fluorine containing gas.

8. A non-transitory computer-readable storage medium storing a computer executable program that, when executed, causes a computer to control a plasma etching apparatus to perform a plasma etching method comprising:

etching an organic film formed on the substrate to a middle depth using an inorganic film as a mask by generating plasma between an upper electrode a surface of which is formed with a silicon containing material and a lower electrode where a substrate to be processed is placed thereon in a processing chamber;

after the etching process, forming a protective film including the silicon containing material of the upper electrode on a side wall of an etching region formed from the etching step by applying a negative DC voltage on the upper electrode while generating the plasma; and after the forming process, continuing the etching process using the plasma thereby etching the organic film to a predetermined depth.

* * * * *